United States Patent [19]

Klaassen et al.

[11] 4,233,617
[45] Nov. 11, 1980

[54] FIELD EFFECT TRANSISTOR WITH INSULATED GATE ELECTRODE

[75] Inventors: Francois M. Klaassen; Johannes A. Appels, both of Eindhoven, Netherlands

[73] Assignee: U.S. Philips Corporation, New York, N.Y.

[21] Appl. No.: 4,003

[22] Filed: Jan. 16, 1979

[30] Foreign Application Priority Data

Jul. 24, 1978 [NL] Netherlands .......................... 7807834

[51] Int. Cl.² ............................................ H01L 29/78
[52] U.S. Cl. ........................................ 357/23; 357/13; 357/55
[58] Field of Search .............................. 357/23, 55, 13

[56] References Cited

U.S. PATENT DOCUMENTS

| | | | |
|---|---|---|---|
| 4,084,175 | 4/1978 | Ouyanh | 357/55 |
| 4,105,475 | 8/1978 | Jenne | 357/55 |
| 4,109,270 | 8/1978 | Von Basse et al. | 357/23 |
| 4,126,881 | 11/1978 | Von Basse et al. | 357/23 |
| 4,145,703 | 3/1979 | Blanchard et al. | 357/55 |

Primary Examiner—Joseph E. Clawson, Jr.
Attorney, Agent, or Firm—T. A. Briody; R. T. Mayer; J. J. Cannon, Jr.

[57] ABSTRACT

A field effect transistor of the V-MOST type in which the channel region comprises a more highly doped part which adjoins the source zone and a lower doped part which surrounds said region, said channel region adjoining the surface and surrounded by an insulation diffusion. The lower-doped part is depleted from the pn junction with the low-doped drain region up to the surface at a voltage which is lower than the breakdown voltage.

8 Claims, 9 Drawing Figures

FIELD EFFECT TRANSISTOR WITH INSULATED GATE ELECTRODE

CROSSREFERENCE TO RELATED APPLICATION

This application is related to U.S. Patent Application entitled "Semiconductor Device", Johannes. A. Appels et al inventors, filed simultaneously herewith.

BACKGROUND OF THE INVENTION

1. Field of the Invention

This invention relates to a field effect transistor with insulated gate electrode having a semiconductor body comprising an island-shaped first region of a first conductivity type which adjoins a first surface and surrounds a first zone of the second conductivity type likewise adjoining said first surface, and a second region of the second conductivity type which surrounds the first region and forms a pn junction therewith and adjoins the oppositely located second surface, a groove being provided in the first surface and extending through the first zone and the first region into the second region, the wall of which groove is coated with an electrically insulating layer on which a gate electrode is provided, the first zone and the second region being provided with connection conductors associated with the source and drain electrodes.

2. Description of the Prior Art

A field effect transistor of the kind described is disclosed in an article in Electronics, June 22, 1978, pp. 105–112.

With such a field effect transistor structure, rather large currents with power of more than 100 watts can be controlled at comparatively high frequency (up to a few hundred MHz).

In the known structure, in which the first region in which the channel is formed is a single region which consists of a usually diffused zone which, with the underlying second region, constitutes a surface-terminating pn junction, however, it is difficult to reach a very high breakdown voltage for said pn junction. In known transistors said breakdown voltage is of the order of at most a few hundred volts. This is due inter alia to the fact that said breakdown voltage is determined to a considerable extent by the edge curvature of the said pn junction and the unfavorable field distribution caused thereby and by surface states. Therefore, breakdown already occurs at comparatively low voltage at or near the surface.

SUMMARY OF THE INVENTION

One of the objects of the invention is to provide a vertical field effect transistor having an insulated gate electrode provided in a groove, known as a V-MOST, which can be used at a considerably higher voltage between the source and drain electrodes than V-MOS transistors of known construction.

The invention is based inter alia on the recognition that this can be achieved by giving the first region a suitably chosen doping concentration and thickness in combination with the addition of an extra semiconductor region of the first conductivity type.

According to the invention, a field effect transistor of the kind described in the preamble is characterized in that the first region forms with the underlying second region a first pn junction extending substantially parallel to the first surface and is bounded laterally at least partly by a third region of the second conductivity type which extends from the first surface down to the second region and forms with the first region a second pn junction having a lower breakdown voltage than the first pn junction, that a fourth region of the first conductivity type adjoining the first surface is present in the first region and separates the first region and the first zone from each other and has a higher doping concentration than the first region, and that the doping concentration and the thickness of the first region are so small that when applying a voltage in the reverse direction between the first and the second region the depletion zone extends from the first pn junction up to the first surface throughout the thickness of the first region at a voltage which is lower than the breakdown voltage of the second pn junction.

Since the first region of the first conductivity type is already fully depleted from the first pn junction up to the surface at a voltage which is lower than the breakdown voltage of the second pn junction, the field strength at the surface is reduced to such an extent that the breakdown voltage is no longer determined substantially entirely by the second pn junction terminating at the surface but to a considerable extent by the first pn junction extending parallel to the surface and having a considerably higher breakdown voltage. The presence of the more highly doped fourth region prevents the depletion zone from extending from the bottom up to the first zone of the second conductivity type, which generally forms the source zone.

In this manner a very high breakdown voltage can be obtained between the first and the second region which in certain circumstances can approach the high breakdown voltage to be expected theoretically on the basis of the doping concentrations of the first and the second region.

It should be stressed that, if desired, the third region may have the same doping concentration as the second region, thus forming a continuation of the second region. The second pn-junction, in that case, is the locally highly curved edge portion of the pn-junction between the first and second region, which has a considerable lower breakdown voltage than the portion which is parallel to the surface.

In order to get the full benefit of the invention it will preferably be ensured that, taken along the surface, the shortest distance L from the edge of the fourth region up to the second pn junction is larger than the distance over which the depletion zone belonging to the second pn junction extends along the surface at the breakdown voltage of the second pn junction. As a result, this prevents too high a field strength from occurring prematurely at or near the surface between the fourth region and the second pn junction as a result of the lateral penetration of the depletion zone from the second pn junction to the fourth region, when the voltage between the first and the second region is increased.

Although as a result of the condition of the complete depletion of the first region already occurring at a voltage lower than the breakdown voltage, a considerable decrease of the surface field strength and hence a considerable improvement of the breakdown voltage is achieved in all cases, a further optimization of the breakdown voltage can be obtained when the maxima in the field strength which occur at the second pn junction and near the edge of the fourth region are also approximately of the same value. As will be explained in detail with reference to the drawings, a preferred embodiment is therefore characterized in that the doping concentration N in atoms per cm³ and thickness d in cm of the first region satisfy the conditions $$2,6.10^2 \epsilon E \sqrt{\frac{V_B}{L}} \leq N.d \leq 5.1.10^5 \epsilon E,$$

wherein $\epsilon$ is the relative dielectric constant and E the critical field strength in volt/cm at which avalanche multiplication occurs in the semiconductor material of the first region, L is the distance in cm from the fourth region up to the second pn junction, and $V_B$ is the unidimensionally computed value of the breakdown voltage between the second and the fourth region. When in this state the conditions are moreover chosen to be so that N.d is substantially equal to $3,0.10^5 \cdot \epsilon E$ and $L \geq 1.4.10^{-5} V_B$, it is ensured that the maximum field strength of the first pn junction will always be larger than in the abovementioned maxima occurring at the surface so that the breakdown voltage always occurs at the first pn junction and not at or near the surface.

In order to be able to store the major part of the charge in the depletion region in the second region, thus reducing the minimum thickness of the first region, it is often preferred that the second region at least adjacent to the first region has a lower doping concentration than the first region.

Generally, but not necessarily, the second region consists of a lower-doped part adjoining the first region and a more highly doped part which adjoins the second surface, on which more highly doped part the connection conductor (generally the drain electrode) is provided. The depletion zone of the first pn junction may extend without any disadvantage over the whole thickness from the lower-doped part up to or into the more highly doped part. In some cases it may be desired that said lower-doped part is so thick that at the breakdown voltage of the first pn junction, the depletion zone extends in the second region over a distance which is slightly smaller than the thickness of said lower-doped part. However, in that case, the non-depleted part must be thin so as not to provide any undesired high resistance.

Although the field effect transistor structure described can also be formed in a different manner, a construction is preferred, inter alia for technological reasons, in which the first region is formed by an epitaxial layer of the first conductivity type provided on the second region.

The first region may be bounded laterally by the groove and further at least partly by the pn junction. For the remaining part the first region may be bounded, for example, by a counter-sunk insulating pattern or by another groove the wall of which is passivated. According to a further preferred embodiment which can be realized very simply, however, the first region is surrounded entirely, along the part of its circumference not bounded by the groove having a gate electrode, by the third region, so that the first region is bounded entirely laterally by the groove in which the gate electrode is present, and by the second pn junction.

Furthermore, in the various embodiments, the source electrode is advantageously formed by a conductive layer which is present on the first surface and which adjoins both the first zone of the second conductivity type (the source zone) and the fourth region of the first conductivity type.

BRIEF DESCRIPTION OF THE DRAWINGS

The invention will now be described in greater detail with reference to the drawing, in which.

DESCRIPTION OF THE PREFERRED EMBODIMENTS

Figure 1:
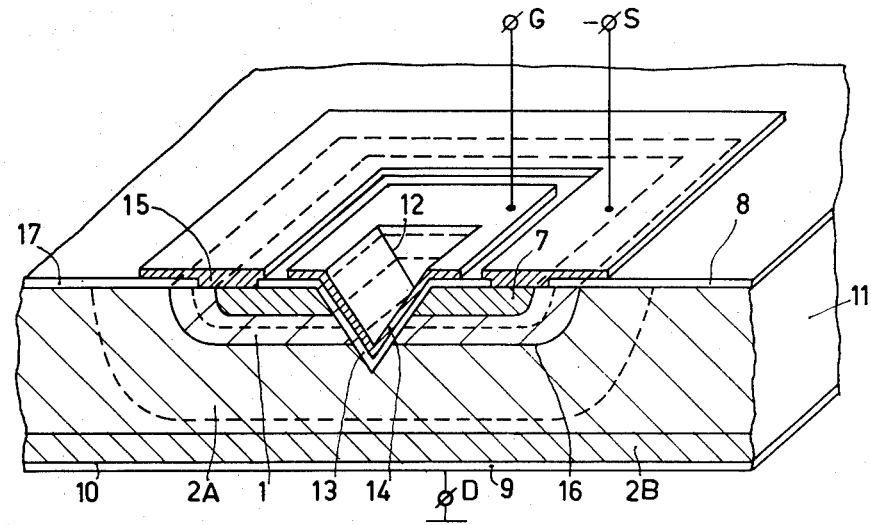
FIG. 1 shows diagrammatically a known field effect transistor partly in cross-section and partly in perspective.

The figures are diagrammatic and not drawn to scale. Corresponding parts are generally referred to by the same reference numerals. In the cross-sectional views, semiconductor regions of the same conductivity type are shaded in the same direction.

Figure 2:
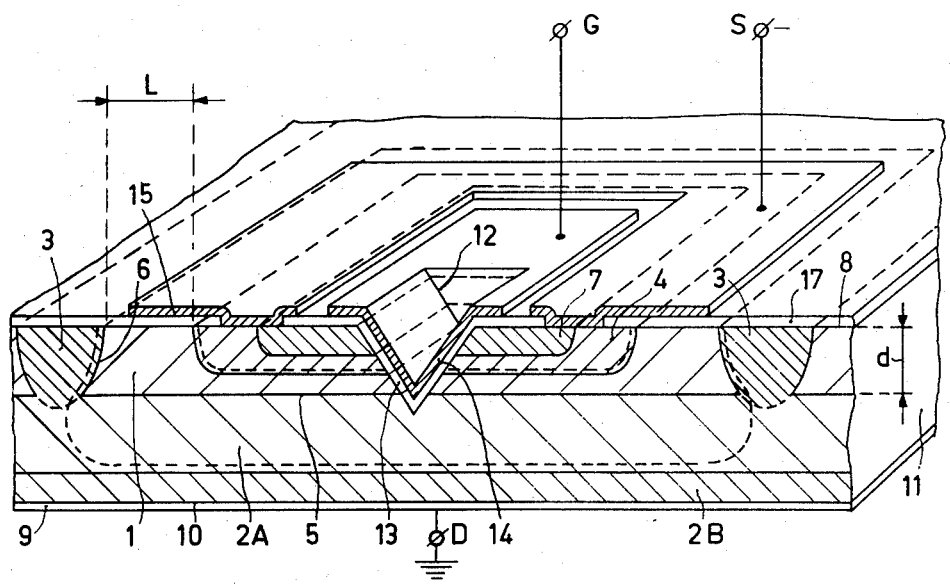
FIG. 2 shows diagrammatically a field effect transistor according to the invention partly in cross-section and partly in perspective.

For simplicity it is assumed that in FIGS. 1 and 2 the plane of cross-section, which is the plane of the drawing, is a symmetry plane of the field effect transistor. However, this is by no means necessary.

FIG. 1 shows a known field effect transistor with insulated gate electrode partly as a cross-sectional view and partly as a perspective view. The field effect transistor has a semiconductor body 11, in this example of silicon although other semiconductor materials, for example germanium, gallium arsenide, and so on, may also be used. The semiconductor body includes an island-shaped first region 1 of a first conductivity type, in this example of the p-conductivity type, which adjoins a first surface 8 and which surrounds a first zone 7 of the second n-conductivity type likewise adjoining surface 8. Furthermore, a second region 2A-2B of the second, n-conductivity type surrounds the first region 1 and forms a pn junction 16 therewith. This region 2A-2B consists of a lower-doped part 2A adjoining the first region and a more highly doped part 2B adjoining second surface 10. In first surface 8 a V-shaped groove 12 is provided which extends into second region 2A through first zone 7 and first region 1. The wall of groove 12 is coated with an electrically insulating layer 13, in this example of silicon oxide, although any other insulating material, for example silicon nitride, aluminium oxide, and so on, may also be used. A gate electrode (connection G) in the form of a metal layer 14 is provided on insulating layer 13. First zone 7 and second region 2A are provided with connection conductors associated with the source and drain electrodes in the form of metal layers 9 and 15 in which in this example electrode 15 is the source electrode (connection S) and the electrode 9 is the drain electrode (connection D), although the reverse may also be the case.

The field effect transistor described so far may have a very short channel length which is determined by the cross-section of layer-shaped region 1 between source zone 7 and drain zone 2. As a result of this the transistor is suitable for use at very high frequencies.

The doping concentrations and the dimensions in the above-described known field effect transistor are such that the breakdown voltage of pn junction 16 region 1 is not yet fully depleted from the horizontal part of junction 16 up to the surface 8. The boundaries of the depletion zone near breakdown are shown in broken lines.

Figure 3:
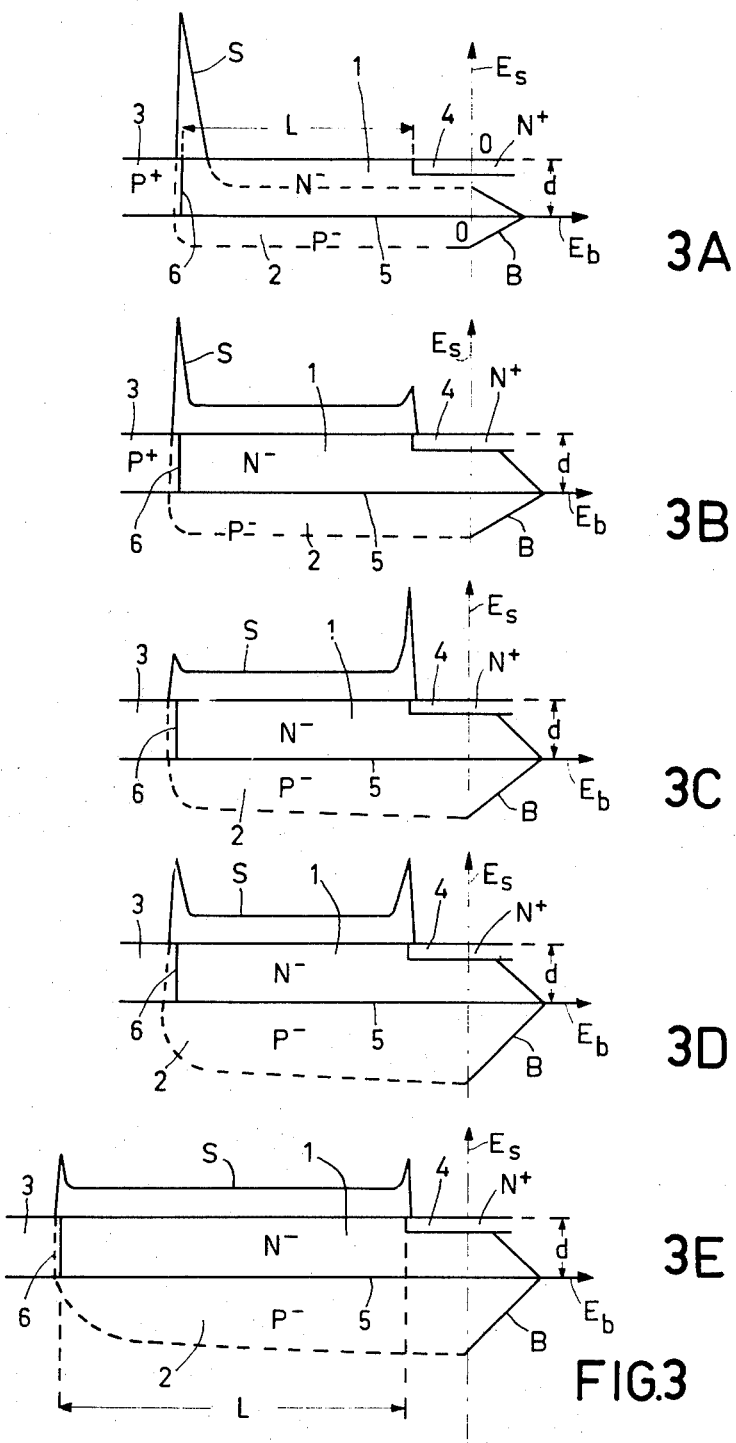
FIGS. 3A to 3E show the field distribution with various dimensions and dopings.

As a result of this the breakdown voltage of pn junction 16 can generally not be made very high as a result of inter alia the edge curvature and the surface states so that an unfavorable field distribution is formed at the surface as will be explained in detail hereinafter with reference to FIGS. 3 and 4.

FIG. 2 shows a field effect transistor according to the invention, also partly in cross section and partly in perspective. This field effect transistor differs from the known transistor as shown in FIG. 1 in the following respects. First of all, first region 1 is formed by an epitaxial layer which, with underlying second region 2A-2B forms a first pn junction 5 extending substantially parallel to first surface 8, while it is bounded laterally at least partly, in this example entirely, by a highly doped third region 3 of the second, n-conductivity type which extends from first surface 8 down to second region 2, and, with first region 1, forms a second pn junction 6 which, inter alia as a result of the high doping of region 3, in itself has a lower breakdown voltage than first pn junction 5. Furthermore, in contrast with the known field effect transistor shown in FIG. 1, a fourth region 4 of the first, p-conductivity type adjoining first surface 8 is present in first region 1 and separates first region 1 and first zone 7 from each other and has a higher doping concentration than first region 1. Furthermore, according to the invention, the doping concentration N and the thickness d of first region 1 are so small that upon applying a voltage in the reverse direction between first region 1 and second region 2 the depletion zone extends from first pn junction 5 upwards up to first surface 8 throughout the thickness d of first region 1 at a voltage which is lower than the breakdown voltage of second pn junction 6. The boundaries of the depletion zone in these circumstances are shown diagrammatically in FIG. 2 by broken lines. The boundaries of regions 7, 4, 1 and 3 at surface 8 are also shown in broken lines in the perspective part of FIGS. 1 and 2.

Since region 1 in the field effect transistor according to the invention already is depleted entirely long before breakdown occurs, the field strength at surface 8 is considerably reduced as compared with the known device shown in FIG. 1. Therefore, the breakdown voltage is determined to a considerable extent by the properties of horizontal pn junction 5 extending within the bulk of the semiconductor body instead of by second pn junction 6 extending transversely to surface 8. The breakdown voltage thus achieved may be very high and may approach very closely the breakdown voltage to be expected theoretically on the basis of the doping of regions 1 and 2. In this manner the possibility exists of manufacturing V-MOS transistors which are suitable for voltages of many hundreds of volts and even more than 1000 volts.

The following doping concentrations and thicknesses have been used in the field effect transistor shown in FIG. 2:

| Region | Thickness | Doping concentration |
|---|---|---|
| 7 | 2μm | $10^{20}$ atoms/cm$^3$ |
| 4 | 3μm (from surface 8) | $3 \cdot 10^{16}$ at/cm$^3$ |

-continued

| Region | Thickness | Doping concentration |
|---|---|---|
| 1 | (d) = 5μm (from surface 8) | (N=)$2 \cdot 10^{15}$ at/cm$^3$ |
| 2A | 100μm | $1.7 \cdot 10^{14}$ at/cm$^3$ |
| 2B | 150μm | $10^{19}$ at/cm$^3$ |

The distance L in FIG. 2 is equally long along the whole circumference of the region 4 and is 170 μm = $1.70 \cdot 10^{-2}$ cm.

Under these conditions the breakdown voltage between regions 1 and 2 was approximately 1000 volts.

The unidimensionally computed breakdown voltage $V_B$ between regions 2 and 4 is 1200 volts. The breakdown voltage of pn junction 6 would be approximately 150 volts (in the absence of pn junction 5), at which voltage the depletion layer would extend from junction 6 laterally, that is to say in the direction of region 4, over approximately 10 μm, which is less than L.

At the given thicknesses and doping concentrations the depletion zone extends at the breakdown voltage in region 2A over a thickness which is slightly smaller than the thickness of region 2A, namely over 95 μm while it is also avoided that the depletion zone of pn junction 6 reaches region 4 at a voltage value which is smaller than the breakdown voltage of pn junction 6 taken in itself (so in the absence of pn junction 5).

At the said values for N, d, L and $V_B$ for silicon ($\epsilon = 11.7$, $E = 2.5 \cdot 10^5$ volts/cm, L and d in cm) the condition is satisfied that $$2.6 \cdot 10^2 \, \epsilon E \sqrt{\frac{V_B}{L}} = 2.02 \cdot 10^{11}$$
$$N \cdot d = 10^{12}$$

and $$5.1 \cdot 10^5 \epsilon E = 1.49 \cdot 10^{12}$$

so that the condition $$2.6 \cdot 10^2 \, \epsilon E \sqrt{\frac{V_B}{L}} \leq N \cdot d \leq 5.1 \cdot 10^5 \, \epsilon E.$$

is satisfied.

Even the most favorable condition $N \cdot d \approx 3.0 \cdot 10^{-5} \cdot \epsilon E = 9 \cdot 10^{11}$ cm$^{-2}$ (in the above example $N \cdot d = 10^{12}$ cm$^{-2}$) with $L \geq 1.4 \cdot 10^{-5}$ $V_B = 1.68 \cdot 10^{-2}$ cm (in the example $L = 1.7 \cdot 10^{-2}$ cm) is satisfied with good approximation.

Region 4 which limits the width of the depletion zone due to its high doping prevents the depletion zone from extending from the drain zone up to the source zone.

In this example, first region 1 is bounded laterally entirely by groove 12 and by second pn junction 6. PN junction 6 and hence region 3, however, could also be replaced along a part of the circumference of region 1 by another boundary, for example, by a countersunk pattern of electrically insulating material.

As in FIG. 1, the channel region is short-circuited with source zone S by a common conductive layer 15 adjoining both zone 7 and region 4. The part of surface 8 not contacted by electrode layers is covered by a layer 17 of silicon oxide, as in FIG. 1.

The field effect transistor described may be manufactured by using conventional doping, oxidation and etching methods with which the known V-MOS transistors are also manufactured. For etching a V-shaped groove, one starts preferably with a semiconductor surface having a (100) orientation in which the groove is etched by means of a selective etchant which, for example, contains KOH. A groove is formed the walls of which extend according to (111) planes, as is known. Since the various manufacturing steps are of no further significance for the invention it is superfluous to describe the manufacture in detail.

It should be stressed that the fourth region 4 may extend to, or even slightly in, the second region 2. This, under certain conditions, may have the advantage of better performance at high frequencies and high current densities, although at the expense of a certain decrease in breakdown voltage.

With reference to FIGS. 3A to 3E and 4 the above-mentioned preferred doping concentrations and dimensions will be further explained.

FIGS. 3A to 3E are diagrammatic cross-sectional views of five different possibilities for the field distribution in a diode which corresponds to the island-shaped first region in the preceding example. For clarity, only half of the diode is shown; the diode is assumed to be rotationally symmetrical about the axis denoted by $E_s$. The region 1 corresponds to the island-shaped "first region" in each of the preceding examples, pn junction 5 corresponds to the first pn junction and pn junction 6 corresponds to the second pn junction. In these Figures, region 1 is assumed to be n-conductive and the region 2 is assumed to be p-conductive; however, the conductivity types may also be reversed, as is the case in FIGS. 1 and 2. The doping concentration of region 2 is the same in all the FIGS. 3A to 3E.

When between the $N^-$ region 1 (via $N^+$ contact region 4) and $P^-$ region 2 a voltage is applied in the reverse direction across pn junctions 5 and 6, a variation of the field strength distribution $E_s$ occurs along the surface according to the line S, while in the vertical direction the field strength $E_b$ varies according to the line B.

FIG. 3A shows the case in which full depletion of layer 1 does not yet occur at the breakdown voltage. A high maximum value of the field strength $E_s$ occurs at the surface at pn junction 6 which, due to the high doping of $P^+$ region 3, is higher than the maximum value of the field strength $E_b$ which, viewed in a vertical direction, occurs at pn junction 5. When the critical field strength E is exceeded (for silicon approximately $2.5 \cdot 10^5$ volts/cm and slightly dependent on the doping), breakdown occurs at the surface near junction 6 before the depletion zone (shown in broken lines in FIG. 3A) extends in the vertical direction from junction 5 to the surface.

FIGS. 3B to 3E show cases in which the doping concentration N and the thickness d of layer 1 are such that prior to the occurrence of surface breakdown at junction 6 layer 1 is fully depleted from junction 5 up to the surface. Over a part of the track between regions 3 and 4 the field strength $E_s$ along the surface is constant while both at the area of the pn junction 6 and the N+N junction at the edge of region 4 (as a result of the edge curvature of the N+N junction) peaks are formed in the field strength distribution.

In the case shown in FIG. 3B, the peak value is highest at junction 6 and higher than the maximum value of $E_b$ at junction 5 so that breakdown will occur at that area at the surface but at comparatively higher values than in the case of FIG. 3A since the field strength distribution at the surface is more homogeneous and the maxima will thus decrease. The case of FIG. 3B may be obtained from that of FIG. 3A, for example, by reducing the thickness d of layer 1, with the doping remaining the same.

FIG. 3C shows the reverse case of FIG. 3B as regards surface field strength. In this case the field strength peak at the edge of region 4 is much higher than at pn juenction 6. This case may occur, for example, when layer 1 has a very high resistivity and region 1 is depleted before breakdown voltage occurs. In that case, breakdown may occur at the edge of region 4 when the maximum field strength at said edge is higher than that at pn junction 5.

More favorable is the case shown in FIG. 3D. In this case it is ensured that the doping concentration and the thickness of region 1 are such that the two field strength peaks at the surface are substantially equal. Although breakdown at the surface will still occur when, as shown in FIG. 3D, the maximum field strength $E_b$ at pn junction 5 is smaller than the maxima at the surface, the maximum field strength at the surface becomes lower in this case, by making the field strength distribution S at the surface to be symmetrical, than in an asymmetrical field strength distribution so that breakdown occurs at a higher voltage.

FIG. 3E finally shows a case in which the maximum field strength at the surface at an arbitrary reverse voltage is lower than the maximum field strength at pn junction 5 by an efficacious choice of doping and thickness of layer 1 and by increasing the distance L with a given doping concentration of region 2. As a result of this, breakdown in this case will always occur within the semiconductor body at pn junction 5 and not at the surface.

It is furthermore to be noted that at too small a value of said distance L, the field strength at the surface will increase (as a matter of fact the overall voltage between regions 3 and 4 determines the area between the curve S and the line $E_s = 0$), so that breakdown at the surface occurs at lower voltage.

Figure 4:
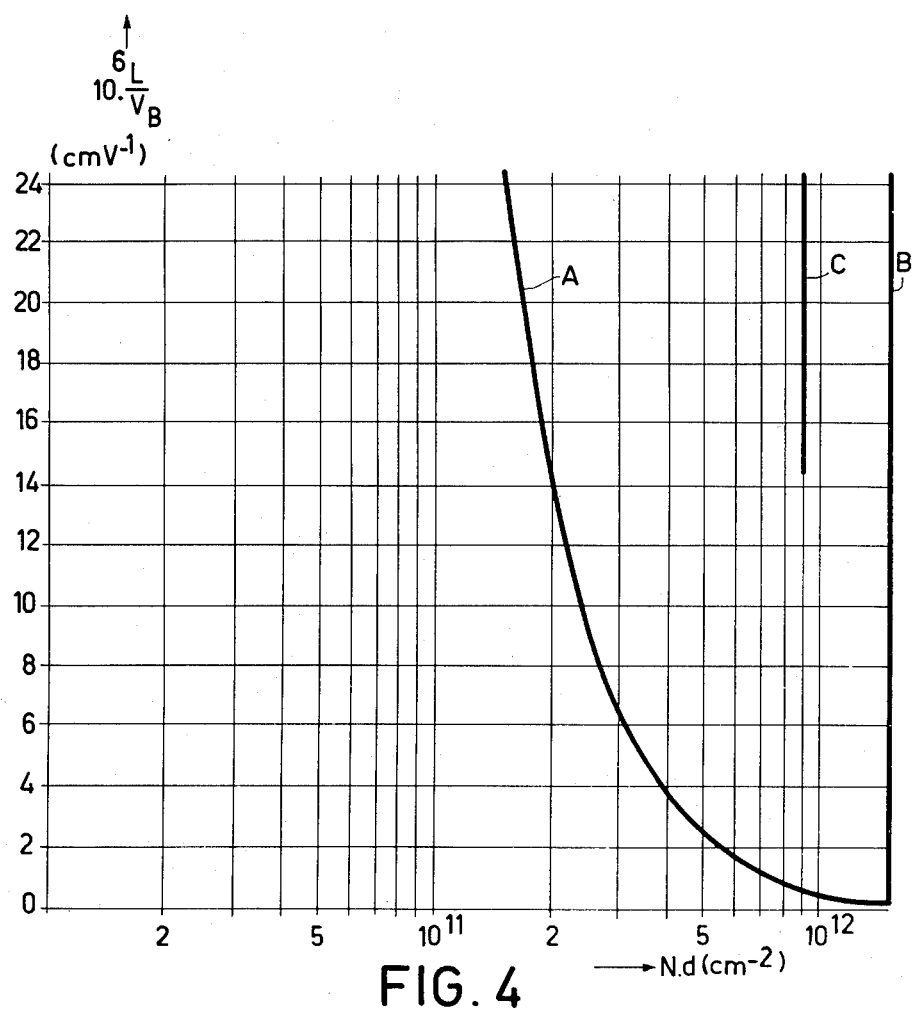
FIG. 4 shows the relationship between the doping and the dimensions of the first region for a preferred embodiment.

Calculations have proved that the most favorable values for the breakdown voltage are obtained within the area enclosed in FIG. 4 by the lines A and B. In FIG. 4 the product of the doping concentration N in atoms per $cm^3$ and the thickness d in cm of the region 1 is plotted on the horizontal axis for silicon as a semiconductor and the value of $10^6 \cdot (L/V_B)$ with L in cm and $V_B$ in volts is plotted on the vertical axis. $V_B$ is the unidimensionally computed value o the breakdown voltage of pn junction 5, that is to say in FIGS. 3A to 3E the breakdown voltage of the $N^+N^-P^-$ structure when it is assumed that the doping concentrations of regions 1 and 2 are homogeneous, so pn junction 5 is abrupt, that the $N^+$ region 4 has a substantially negligible series resistance, and that the $N^+N^-P^-$ structure extends infinitely far in all directions perpendicular to the axis $E_s$. This fictitious breakdown voltage $V_B$ can very simply be computed with the said assumptions. For that purpose see, for example, S. M. Sze, Physics of Semiconductor Devices, Wiley & Sons, New York 1969, chapter 5.

For the case in which silicon is chosen as a semiconductor material it appears that for values of $N \times d$ which lie between the lines A and B, that is to say for $$7.6 \cdot 10^8 \sqrt{\frac{V_B}{L}} \leq N \cdot d \leq 1.5 \cdot 10^{12}$$

the condition of FIG. 3D (symmetrical field distribution at the surface) is satisfied.

If the condition of FIG. 3E is also to be satisfied (symmetrical field distribution at the surface, with breakdown at pn junction 5) values for L, N and d should be chosen which lie on or near the line C of FIG. 4. For $(L/V_B)$ $1.4 \cdot 10^{-5}$ it holds substantially that $N \cdot d = 9 \cdot 10^{11}$ cm$^{-2}$.

As already said, the values of FIG. 4 apply to silicon which has a critical field strength E of approximately $2.5 \cdot 10^5$ volts per cm and a dielectric constant $\epsilon$ of approximately 11.7. In general, for semiconductor materials having a relative dielectric constant $\epsilon$ and a critical field strength E it holds that between the lines A and B $$2.6 \cdot 10^2 \, \epsilon E \times \sqrt{\frac{V_B}{L}} \leq N \cdot d \; 5.1 \cdot 10^5 \, \epsilon \, E$$

and for the line C: $N \cdot d$ substantially equal to $3 \cdot 10^5 \epsilon E$ and, in this case also, $(L/V_B) \geq 1.4 \cdot 10^{-5}$.

The values $\epsilon$ and E can be found from the available literature by those skilled in the art. For the critical field strength E reference may be made, for example, to S. M. Sze, Physics of Semiconductor Devices, Wiley & Sons, New York 1969, p. 117, FIG. 25.

By means of what has been described above with reference to FIGS. 3A and 3E and 4, those skilled in the art can select the dopings and dimensions which are most favorable in given circumstances for the field effect transistor according to the invention. It will not always be necessary or desirable that in all circumstances (FIG. 4, curve C) surface breakdown is avoided. It will even not always be necessary to operate within the lines A and B of FIG. 4 since outside said lines high (surface) breakdown voltages can also be achieved. However, the condition that the island-shaped region in vertical direction is fully depleted before surface breakdown occurs will always have to be satisfied.

The invention is not restricted to the embodiment described. For example, the field effect transistor need by no means be symmetrical with respect to the plane of cross-section of FIG. 2. In particular, the lateral distance between regions 3 and 4 need not be the same everywhere; in that case L denotes the shortest distance. The distance from groove 12 to the edges of regions 4 and 1 may also be different on either side of the groove.

Figure 5:
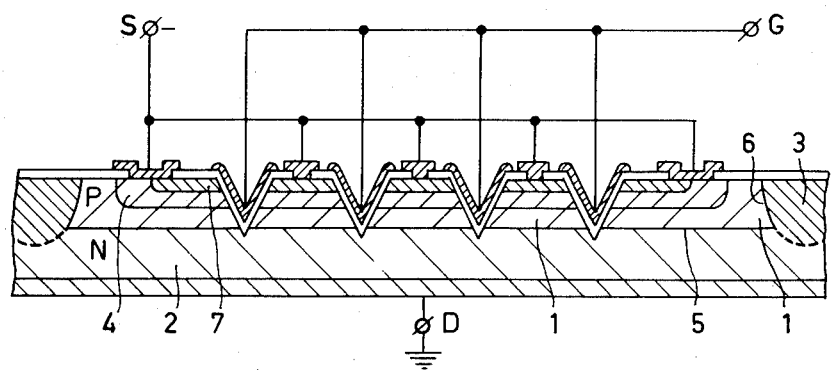
FIG. 5 shows another embodiment of a field effect transistor according to the invention.

Instead of one single groove, several grooves may be present each having a control electrode, which control electrodes may or may not be connected together. In this manner several parallel-arranged field effect structures are obtained as shown, for example, diagrammatically in the cross-sectional view of FIG. 5.

Furthermore, groove 12 need not necessarily be V-shaped.

Although a discrete V-MOST for high current and voltage has been described in the example, the field effect transistor according to the invention can also be readily combined together with other V-MOS transistors and active and passive circuit elements of a different nature on the same semiconductor plate as a monolithic integrated circuit.

Semiconductor materials other than silicon, for example gemanium, gallium arsenide and so on, and insulating layers other than silicon oxide, for example, silicon nitride-containing layers, may also be used. Furthermore, the conductivity types of the semiconductor regions may be replaced by their opposite types.

We claim:

1. A field effect transistor with insulated gate electrode having a semiconductor body, said semiconductor body having first and second surfaces, oppositely located, comprising:

an island-shaped first region of a first conductivity type which adjoins said first surface;

a first zone of the second conductivity type within said island shaped first region and likewise adjoining said first surface;

a second region of the second conductivity type which surrounds said first region and forms a pn junction therewith and adjoins said oppositely located second surface;

a groove in said first surface and extending through said first zone and said first region into said second region;

the wall of said groove being coated with an electrically insulating layer;

a gate electrode on said layer;

said first zone and said second region being provided with connection conductors associated with the source and drain electrodes of said field effect transistor;

a third region of said second conductivity type extending from said first surface to said second region;

said first region forming with said underlying second region a first pn junction extending substantially parallel to said first surface and bounded laterally at least partly by said third region of the second conductivity type which extends from the first surface down to the second region and forms with the first region a second pn junction having a lower breakdown voltage than said first pn junction;

a fourth region of said first conductivity type adjoining said first surface present in said first region separating said first region and said first zone from each other and having a higher doping concentration than the first region; and the doping concentration and the thickness of said first region being so small that when applying a voltage in reverse direction between said first and said second regions, the depletion zone of said transistor extends from said first pn junction up to said first surface throughout the thickness of said first region at a voltage which is lower than the breakdown voltage of said second pn junction.

2. A field effect transistor as claimed in claim 1, wherein:

the shortest distance L from the edge of said fourth region up to said second pn junction, taken along the surface, is larger than the distance over which the depletion zone associated with said second pn junction extends along the surface at the breakdown voltage of said second pn junction.

3. A field effect transistor as claimed in claim 2, wherein:

the doping concentration N in atoms per cm$^3$ and the thickness d in cm of the first region satisfy the condition $$2,6.10^2 \epsilon E \sqrt{\frac{V_B}{L}} \leq N.d \leq 5.1.10^5 \epsilon E,$$

wherein $\epsilon$ is the relative dielectric constant and E the critical field strength in volt/cm at which avalanche multiplication occurs in the semiconductor material of said first region, L is the distance in cm from said fourth region up to said second pn junction, and $V_B$ is the unidimensionally computed value of the breakdown voltage between said second and said fourth regions.

4. A field effect transistor as claimed in claim 3, wherein N.d. is substantially equal to $3.0 \cdot 10^5 \epsilon E$, and $L \geq 1.4 \cdot 10^{-5} V_B$.

5. A field effect transistor as claimed in claim 1, wherein the doping concentration of at least the portion of the second region adjoining the first region is lower than that of the first region.

6. A field effect transistor as claimed in claim 1, wherein the said first region is formed by an epitaxial layer of said first conductivity type provided on said second region.

7. A field effect transistor as claimed in claim 1, wherein said first region is bounded laterally entirely by said groove and by said second pn junction.

8. A field effect transistor as claimed in claim 1, wherein the source electrode of said transistor is formed by a conductive layer which is present on said first surface and which adjoins both said first zone of said second conductivity type and said fourth region of said first conductivity type.

* * * * *

UNITED STATES PATENT AND TRADEMARK OFFICE
CERTIFICATE OF CORRECTION

PATENT NO. : 4,233,617
DATED : November 11, 1980
INVENTOR(S) : Francois M. Klaassen et al.

It is certified that error appears in the above—identified patent and that said Letters Patent is hereby corrected as shown below:

Col. 11, line 8, The formula should read $$-- \quad 2.6 \cdot 10^2 \leq E \sqrt{\frac{V_B}{L}} / N.d \leq 5.1 \cdot 10^5 \leq E, \quad --$$

Signed and Sealed this

Thirtieth Day of June 1981

[SEAL]

Attest:

RENE D. TEGTMEYER

Attesting Officer     Acting Commissioner of Patents and Trademarks